(12) United States Patent
Do et al.

(10) Patent No.: US 9,245,638 B2
(45) Date of Patent: Jan. 26, 2016

(54) METHOD OF OPERATING A SPLIT GATE FLASH MEMORY CELL WITH COUPLING GATE

(71) Applicant: Silicon Storage Technology, Inc., San Jose, CA (US)

(72) Inventors: Nhan Do, Saratoga, CA (US); Elizabeth A. Cuevas, Los Gatos, CA (US); Yuri Tkachev, Sunnyvale, CA (US); Mandana Tadayoni, Cupertino, CA (US); Henry A. Om'mani, Santa Clara, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/216,776

(22) Filed: Mar. 17, 2014

(65) Prior Publication Data
US 2014/0198578 A1 Jul. 17, 2014

Related U.S. Application Data

(62) Division of application No. 13/463,558, filed on May 3, 2012, now Pat. No. 8,711,636.

(60) Provisional application No. 61/485,805, filed on May 13, 2011.

(51) Int. Cl.
*G11C 16/04* (2006.01)
*G11C 16/26* (2006.01)
(Continued)

(52) U.S. Cl.
CPC ............ *G11C 16/26* (2013.01); *G11C 16/0433* (2013.01); *G11C 16/14* (2013.01); *H01L 27/115* (2013.01)

(58) Field of Classification Search
CPC ....................................................... G11C 16/26
USPC .................................................... 365/185.14
See application file for complete search history.

(56) References Cited

U.S. PATENT DOCUMENTS

| 5,029,130 A | 7/1991 | Yeh |
| 5,242,848 A | 9/1993 | Yeh et al |

(Continued)

FOREIGN PATENT DOCUMENTS

| CN | 1545707 A | 11/2004 |
| CN | 1841783 A | 10/2006 |
| JP | 2006-332641 | 12/2006 |

OTHER PUBLICATIONS

PCT Search Report and Written Opinion dated Jul. 13, 2012 corresponding to the related PCT Patent Application No. US12/036452.

(Continued)

*Primary Examiner* — Son Mai
(74) *Attorney, Agent, or Firm* — DLA Piper LLP (US)

(57) ABSTRACT

A method of operating a memory cell that comprises first and second regions spaced apart in a substrate with a channel region therebetween, a floating gate disposed over the channel region and the fir region, a control gate disposed over the channel region and laterally adjacent to the floating gate with a portion disposed over the floating gate, and a coupling gate disposed over the first region and laterally adjacent to the floating gate. A method of erasing the memory cell includes applying a positive voltage to the control gate and a negative voltage to the coupling gate. A method of reading the memory cell includes applying positive voltages to the control gate, to the coupling gate, and to one of the first and second regions.

3 Claims, 1 Drawing Sheet

(51) Int. Cl.
  *H01L 27/115*  (2006.01)
  *G11C 16/14*  (2006.01)

(56) References Cited

U.S. PATENT DOCUMENTS

| | | | |
|---|---|---|---|
| 5,455,792 A * | 10/1995 | Yi | 365/185.15 |
| 5,644,532 A | 7/1997 | Chang et al. | |
| 6,091,104 A | 7/2000 | Chen | |
| 6,151,248 A | 11/2000 | Harari et al. | |
| 6,747,310 B2 | 6/2004 | Fan et al. | |
| 6,788,573 B2 | 9/2004 | Choi | |
| 6,855,980 B2 | 2/2005 | Wang et al. | |
| 6,885,586 B2 | 4/2005 | Chen et al. | |
| 6,914,290 B2 | 7/2005 | Yoo et al. | |
| 6,992,929 B2 | 1/2006 | Chen et al. | |
| 7,057,931 B2 | 6/2006 | Lutze et al. | |
| 7,265,411 B2 * | 9/2007 | Kang | 257/317 |
| 7,315,056 B2 | 1/2008 | Klinger et al. | |
| 7,492,002 B2 * | 2/2009 | Jeon et al. | 257/321 |
| 7,598,561 B2 | 10/2009 | Chen et al. | |
| 7,626,864 B2 | 12/2009 | Wang et al. | |
| 7,668,013 B2 | 2/2010 | Chern et al. | |
| 7,718,488 B2 | 5/2010 | Chen et al. | |
| 7,839,682 B2 * | 11/2010 | Tran et al. | 365/185.05 |
| 7,868,375 B2 | 1/2011 | Liu et al. | |
| 7,927,994 B1 | 4/2011 | Liu et al. | |
| 8,058,680 B2 * | 11/2011 | Io | 257/319 |
| 8,059,473 B2 | 11/2011 | Jeon et al. | |
| 8,384,147 B2 | 2/2013 | Do et al. | |
| 8,488,388 B2 | 7/2013 | Markov et al. | |
| 8,669,607 B1 * | 3/2014 | Tsair et al. | 257/316 |
| 2003/0127684 A1 | 7/2003 | Yoo et al. | |
| 2005/0207199 A1 * | 9/2005 | Chen et al. | 365/51 |
| 2006/0068529 A1 | 3/2006 | Chen et al. | |
| 2009/0141562 A1 | 6/2009 | Jeon et al. | |
| 2009/0201744 A1 | 8/2009 | Chern et al. | |
| 2010/0054043 A1 | 3/2010 | Liu et al. | |
| 2010/0157687 A1 | 6/2010 | Chern et al. | |
| 2010/0289071 A1 | 11/2010 | Jeon et al. | |

OTHER PUBLICATIONS

Japanese Office Action dated Jul. 23, 2014 corresponding to the related Japanese Patent Application No. 2014-511391. (English and Japanese translations).

Chinese Office Action dated Nov. 28, 2014 corresponding to the related Chinese Patent Application No. 201280023033.7. (English and Chinese Translations attached).

Taiwanese Office Action and Search Report received on Feb. 13, 2015 corresponding to the related Taiwanese Patent Application No. 101116882.

Korean Notice of Allowance dated May 29, 2015 corresponding to the related Korean Patent Application No. 10-2013-7032631.

* cited by examiner

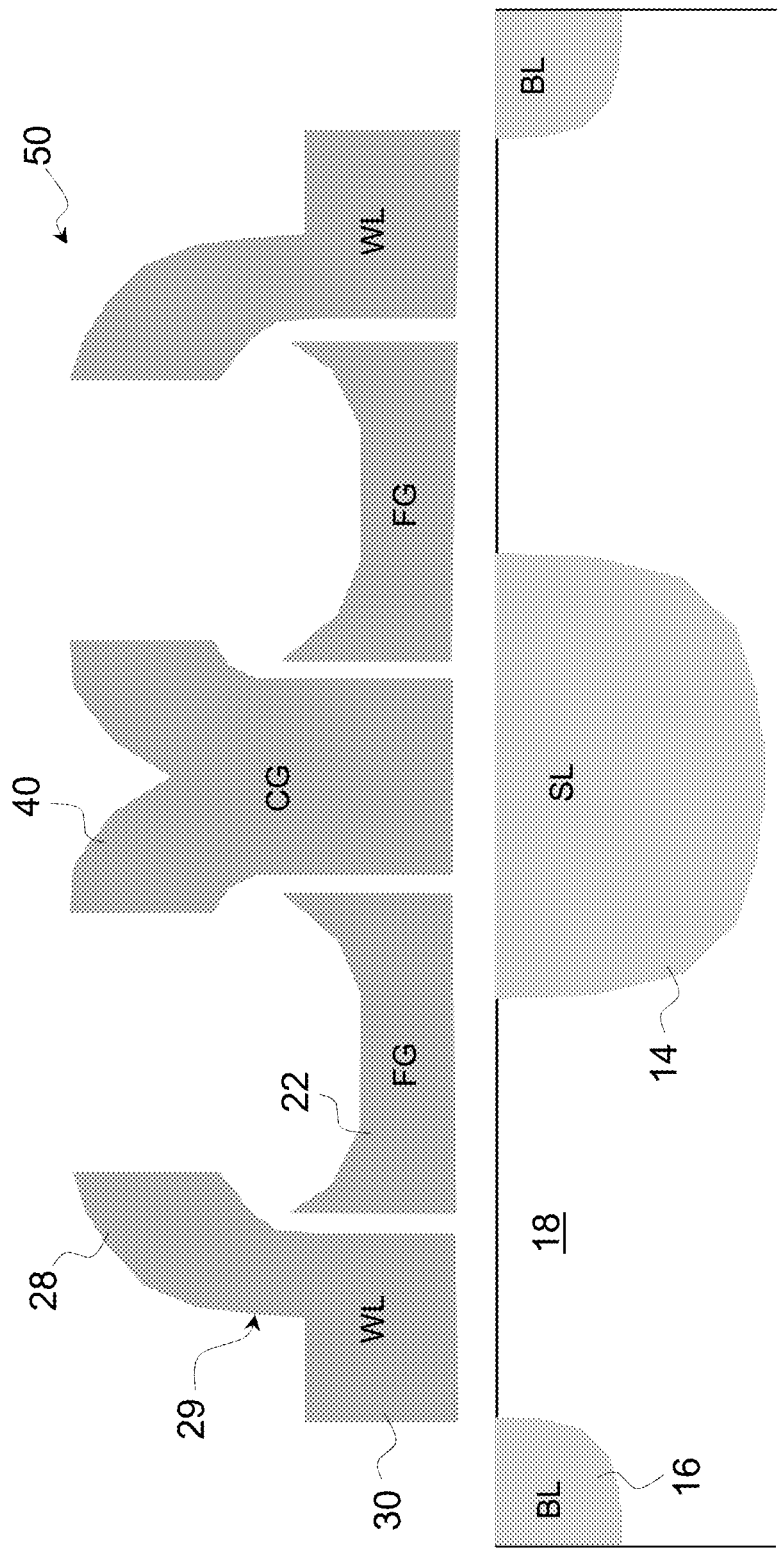

METHOD OF OPERATING A SPLIT GATE FLASH MEMORY CELL WITH COUPLING GATE

RELATED APPLICATIONS

This application is a divisional of U.S. patent application Ser. No. 13/463,558, filed May 3, 2012, which claims the benefit of U.S. Provisional Application No. 61/485,805, filed May 13, 2011, which are both incorporated herein by reference.

TECHNICAL FIELD

The present invention relates to a split gate flash memory cell and more particularly to a method of operating a split gate flash memory cell with a coupling gate to enhance the operations of read and erase.

BACKGROUND OF THE INVENTION

Split gate flash memory cells are well known in the art. One such well known example is disclosed in U.S. Pat. No. 5,029,130 whose disclosure is incorporated herein by reference in its entirety.

As shown in FIG. 1 of U.S. Pat. No. 5,029,130, a split gate flash memory cell 10 comprises a semiconductor substrate 12, with a first conductivity type, such as P. A first region 14 of a second conductivity type, such as N is along the surface of the substrate 12. Spaced apart from the first region 14 is a second region 16 also of the second conductivity type N. Between the first region 14 and the second region 16 is a channel region 18. A floating gate 22 is positioned over a portion of the channel region 18 and over the first region 14 and is capacitively coupled to the first region 14. A control gate 29 has two portions: a first portion 30 is laterally adjacent to the floating gate 22 and is disposed over another portion of the channel region 18, and has little or no overlap with the second region 16. The control gate 29 has a second portion 28 which is connected to the first portion 30 and is disposed over the floating gate 22 (only extends part way over floating gate 22 to reduce capacitive coupling therebetween—i.e. only a weak capacitive coupling therebetween).

During the read operation, a zero or near zero voltage is applied to the second region 16, with a first positive voltage applied to the first region 14. A second positive voltage is applied to the control gate 29 turning on the portion of the channel region 18 underneath the control gate 29. In the event the floating gate is programmed, i.e. has stored electron charges, then the positive voltage on the control gate 29 and the positive voltage on the first region 14 are not sufficient to turn on the portion of the channel region 18 underneath the floating gate 22. The low or zero current through the channel region is detected as a first state (e.g. a 1). However, if the floating gate 22 is not programmed (i.e. it lacks stored electron charges), then the positive voltage on the control gate 29 and the positive voltage on the first region 14 are sufficient to cause the floating gate 22 to be capacitively coupled to a more positive voltage, which turns on the portion of the channel region 18 underneath the floating gate 22, thereby turning on the entire channel region 18. The current through the channel region is detected as a second state (e.g. a 0). However, as cell size has shrunk, and dimensions reduced, and the voltages lowered, increasingly it becomes difficult to turn the floating gate 22 on when it is erased. After program-erase cycling, the potential of the floating gate 22 of the erased cell becomes even lower because of electron charge trapping in the tunnel oxide (separating the floating gate 22 and control gate 29) and thus the corresponding decrease of tunneling efficiency. Thus, it is desired to have an additional gate to assist during the read operation, and still be process compatible with the above-described cell.

U.S. Pat. Nos. 6,855,980 and 7,315,056 each disclose a flash memory cell with a floating gate, a control gate to one side thereof and an assist gate over the first region to another side of the floating gate. However, these two patents (whose disclosures are incorporated herein by reference in their entirety) do not disclose the method of using that cell to enhance read and erase operations.

Accordingly, it is one object of the present invention to provide a method of operating a cell during read and erase operations.

SUMMARY OF THE INVENTION

In the present invention, a method of operating a flash memory cell of the type having a substrate of a first conductivity, with a first region of a second type of conductivity along a surface of the substrate. A second region of the second conductivity type is spaced apart from the first region with a channel region therebetween. A floating gate is disposed over a first portion of the channel region, and over a portion of the first region and is capacitively coupled thereto. A control gate is to one side of the floating gate. The control gate has two portions: a first portion that is disposed over a second portion of the channel region and has little or no over lap with the second region and is laterally adjacent to the floating gate, and a second portion that is disposed over the floating gate (preferably extending only partially over the floating gate to so there is minimal capacitive coupling therewith). A coupling gate is laterally adjacent to the floating gate to another side thereof and is over the first region, and is capacitively coupled to the floating gate. In the method of the present invention, a read operation is accomplished by applying a first positive voltage to both the control gate and to the coupling gate while a voltage differential is applied between the first region and the second region. In the event the floating gate is not programmed, the first positive voltage causes the channel region underneath the floating gate to be turned on, whereas if the floating gate is programmed, the first positive voltage is insufficient to cause the portion of the channel region underneath the floating gate to be turned on. In an erase operation, the first and second regions are supplied with ground voltage while a negative voltage is applied to the coupling gate and a second positive voltage is applied to the control gate. Because a negative voltage is applied to the coupling gate, and due to the strong capacitive coupling between the coupling gate and its adjacent floating gate, the second positive voltage can be lower than if no negative voltage were applied to the coupling gate. Finally, in a method of programming, a third positive voltage is applied to the first region, while a ground or low positive voltage (lower than Vcc) is applied to the second region. A voltage is applied to the control gate sufficient to turn on the channel region underneath the control gate. Electrons are then accelerated from the second region to the first region and as they near the junction of the floating gate they are abruptly injected onto the floating gate.

BRIEF DESCRIPTION OF THE DRAWINGS

FIG. 1 is a cross sectional schematic diagram of a flash memory cell to which the method of the present invention may be used.

DETAILED DESCRIPTION OF THE INVENTION

Referring to FIG. 1, there is shown a schematic diagram of a flash memory cell 50 to which the method of the present invention can be used. Because the flash memory cell 50 is similar to the flash cell 10 disclosed in U.S. Pat. No. 5,029,130, like numbers will be used to designate like parts. The cell 50 is formed in a substrate 12 of a first conductivity, such as P type. The substrate 12 has a surface. Along the surface is a first region 14 of a second conductivity type, such N. A second region 16 of the second conductivity type N is also along the surface of the substrate 12 and is spaced apart from the first region 14. A channel region 18 is between the first region 14 and the second region 16. A floating gate 22 is disposed over and insulated from a first portion of the channel region 18 and a portion of the first region 14, and is capacitively coupled thereto. A control gate or word line WL 29 is adjacent to the floating gate 22 to one side and is insulated therefrom. The control gate 29 has two portions: first portion 30 and second portion 28. The control gate first portion 30 is laterally adjacent to the floating gate 22, and is also insulated and over a second portion of the channel region 18, and has little or no overlap with the second region 16. The control gate second portion 28 is disposed over a portion of the floating gate 22 and has minimal capacitive coupling with the floating gate 22 by virtue of the relatively small portion of floating gate 22 that is vertically overlapped by control gate second portion 28. Finally, a coupling gate CG 40 is laterally adjacent to another side of the floating gate 22 and is insulated from the floating gate 22. The coupling gate 40 is also disposed over the first region 14 and is insulated therefrom.

In the operation of the cell 50, the following voltages can be applied. For a read operation:

| Control Gate WL 29 | Coupling Gate CG 40 | Second Region 16 | First Region 14 |
|---|---|---|---|
| 2.5 v, or voltage sufficient to turn on the portion of the channel region 18 underneath the control gate 29 | Same as control gate 29 | 1.0 v | 0 v |

The positive voltage applied to second region 16 could instead be applied to first region 14.

The following voltages can be applied for an erase operation.

| Control Gate WL 29 | Coupling Gate CG 40 | Second Region 16 | First Region 14 |
|---|---|---|---|
| positive voltage (<10 v) | negative voltage (<0 v) | 0 v | 0 v |

The following voltages can be applied for a programming operation.

| Control Gate 29 | Coupling Gate 40 | Second Region 16 | First Region 14 |
|---|---|---|---|
| Less than Vcc but sufficient to turn on the portion of the channel region 18 underneath the control gate 29 | Vcc | 5-10 uA, or a ground or low positive voltage (lower than Vcc) | 9.0 v |

From the foregoing the following advantages of the method of the present invention can be seen.

First, during a read operation, because there is increased capacitive coupling between the coupling gate 40 and the floating gate 22, there is greater assurance of read accuracy and increase in signal to noise ratio is obtained. Second during an erase operation, because there is increased capacitive coupling between the coupling gate 40 and the floating gate 22, the tunneling layer between the floating gate 22 and the control gate 29 can be scaled thinner. This would improve the trap up and thereby improving the endurance.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of reading a memory cell that comprises a substrate of a first conductivity type, first and second regions spaced apart in the substrate of a second conductivity type which define a channel region in the substrate therebetween, a floating gate disposed over and insulated from a first portion of the channel region and the first region, a control gate having first and second portions, wherein the control gate first portion is disposed over and insulated from a second portion of the channel region and is disposed laterally adjacent to and insulated from the floating gate, wherein the control gate second portion is disposed over and insulated from the floating gate, and a coupling gate disposed over and insulated from the first region and laterally adjacent to and insulated from the floating gate, wherein the coupling gate includes a first portion that is disposed over and insulated from the first region and laterally adjacent to and insulated from the floating gate, and a second portion that is disposed over and insulated from the floating gate, with no portion of the coupling gate being disposed over or under the control gate, the method comprising:

applying a positive voltage to the control gate;
applying a positive voltage to the coupling gate; and
applying a positive voltage to one of the first and second regions.

2. The method of claim 1, wherein the positive voltage applied to the control gate is equal to the positive voltage applied to the coupling gate.

3. The method of claim 1, further comprising:
applying a ground voltage to the other one of the first and second regions.

* * * * *